United States Patent
Lee

(10) Patent No.: US 7,808,297 B2
(45) Date of Patent: Oct. 5, 2010

(54) APPARATUS AND METHOD FOR CONTROLLING VOLTAGE OF SEMICONDUCTOR INTEGRATED CIRCUIT

(75) Inventor: Tae-Yong Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 48 days.

(21) Appl. No.: 12/329,040

(22) Filed: Dec. 5, 2008

(65) Prior Publication Data

US 2009/0230943 A1 Sep. 17, 2009

(30) Foreign Application Priority Data

Mar. 12, 2008 (KR) .................... 10-2008-0022760

(51) Int. Cl.
*H03K 17/62* (2006.01)
(52) U.S. Cl. .................... 327/403; 327/530
(58) Field of Classification Search ............ 327/403, 327/530, 535, 538
See application file for complete search history.

(56) References Cited

U.S. PATENT DOCUMENTS 6,909,642 B2 * 6/2005 Lehmann et al. ...... 365/189.09
7,352,230 B2 4/2008 An
7,440,341 B2 10/2008 Lee
2008/0143420 A1 6/2008 An

FOREIGN PATENT DOCUMENTS

JP 2007-172766 7/2007
KR 1020050034141 A 4/2005

* cited by examiner

*Primary Examiner*—Jeffrey S Zweizig
(74) *Attorney, Agent, or Firm*—Baker & McKenzie LLP

(57) ABSTRACT

A device for controlling a voltage of a semiconductor integrated circuit includes a voltage selecting unit that generates a voltage selecting signal for selecting a voltage to be controlled among a plurality of voltages by using a first control signal, a control step selecting unit that generates a control step selection signal for selecting a control step of the voltage to be controlled by using a second control signal, and a voltage controlling unit that controls a level of the voltage to be controlled among the plurality of voltages in response to the control step selection signal.

15 Claims, 3 Drawing Sheets

US 7,808,297 B2

APPARATUS AND METHOD FOR CONTROLLING VOLTAGE OF SEMICONDUCTOR INTEGRATED CIRCUIT

CROSS-REFERENCES TO RELATED APPLICATION

The present application claims priority under 35 U.S.C. §119(a) to Korean patent application number 10-2008-0022760, filed on Mar. 12, 2008, in the Korean Intellectual Property Office, which is incorporated herein by reference in its entirety as if set forth in full.

BACKGROUND

1. Technical Field

The embodiments described herein relate to a semiconductor integrated circuit (IC), and more particularly, to a device and a method for controlling a voltage of a semiconductor IC.

2. Related Art

Generally, a semiconductor IC commonly uses various internal power sources to drive devices within the semiconductor IC. The design of the semiconductor IC includes each internal power having a predetermined reference level. However, when the semiconductor IC is manufactured as an actual product after the circuit design is completed, the reference levels may be different from the reference levels set at the time of an initial design due to several factors during the manufacturing process. Thus, the semiconductor IC has been designed to include a device for controlling the internal power levels during the process of manufacturing the semiconductor IC.

FIG. 1 is a schematic block diagram of conventional device for controlling a voltage of a semiconductor IC. In FIG. 1, the device 1 includes first to fifth counters 11 to 15, first to fifth decoders 21 to 25, and first to fifth voltage controllers 31 to 35. The first to fifth counters 11 to 15 count first to fifth test signals 'TM_VA' to 'TM_VE' input in a pulse form, and output the counted values. The first to fifth decoders 21 to 25 decode the counted values to output first to fifth control step selection signals 'SEL_A' to 'SEL_E'. The first to fifth voltage controllers 31 to 35 control first to fifth voltage VA to VE levels to meet the first to fifth control step selection signals 'SEL_A' to 'SEL_E'.

The first to fifth test signals TM_VA to TM_VE in the pulse form can select the control step of the first to fifth voltages VA to VE according to their input frequency, wherein the control step for each input frequency of the first to fifth test signals 'TM_VA' to 'TM_VE' is previously defined. For example, when the first voltage VA is controlled among the first to fifth voltages VA to VE, the first test signal 'TM_VA' is generated by the frequency corresponding to the desired voltage control step. The first counter 11 counts the first test signal 'TM_VA', and outputs the counted value. The first decoder 21 decodes the counted value output from the first counter 11 to output the first control step selection signal 'SEL_A'. The first voltage controller 31 controls the first voltage VA level to correspond to the first control step selection signal 'SEL_A'.

Accordingly, the device 1 is configured to selectively control a plurality of internal voltages. However, the device 1 includes circuit components for controlling each of the internal voltages, such as a circuit for generating a test signal, a counter, and a decoder. Thus, the device 1 increases a circuit area, thereby decreasing a layout margin of the semiconductor IC. Correspondingly, the device 1 requires an increase in the number of signal lines for transferring signals between these components, thereby increasing the complexity of the circuit design.

SUMMARY

A device and a method for controlling a voltage of a semiconductor IC capable of increasing a layout margin and simplifying a circuit design are described herein.

In one aspect, a device for controlling a voltage of a semiconductor integrated circuit includes a voltage selecting unit that generates a voltage selecting signal for selecting a voltage to be controlled among a plurality of voltages by using a first control signal, a control step selecting unit that generates a control step selection signal for selecting a control step of the voltage to be controlled by using a second control signal, and a voltage controlling unit that controls a level of the voltage to be controlled among the plurality of voltages in response to the control step selection signal.

In another aspect, a method for controlling a voltage of a semiconductor integrated circuit including a plurality of voltage controlling units that controls a plurality of voltage levels, the method includes selecting any one of input paths of the plurality of voltage controlling units according to a first control signal, and inputting a control step selection signal generated according to a second control signal to one of the plurality of voltage controlling units via the selected input path to perform a control of a corresponding voltage level.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
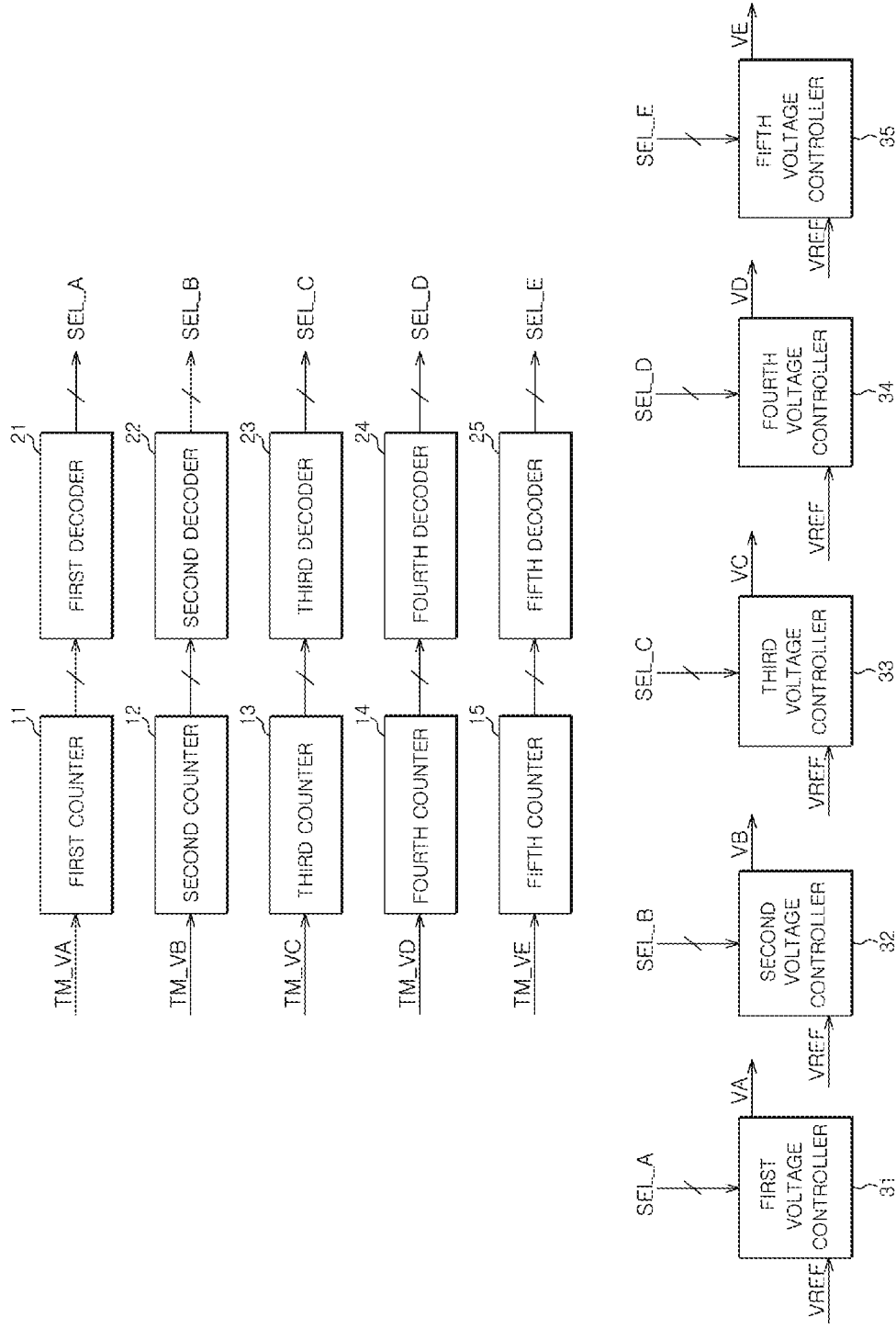
FIG. 1 is a schematic block diagram of conventional device for controlling a voltage of a semiconductor IC.
Figure 2:
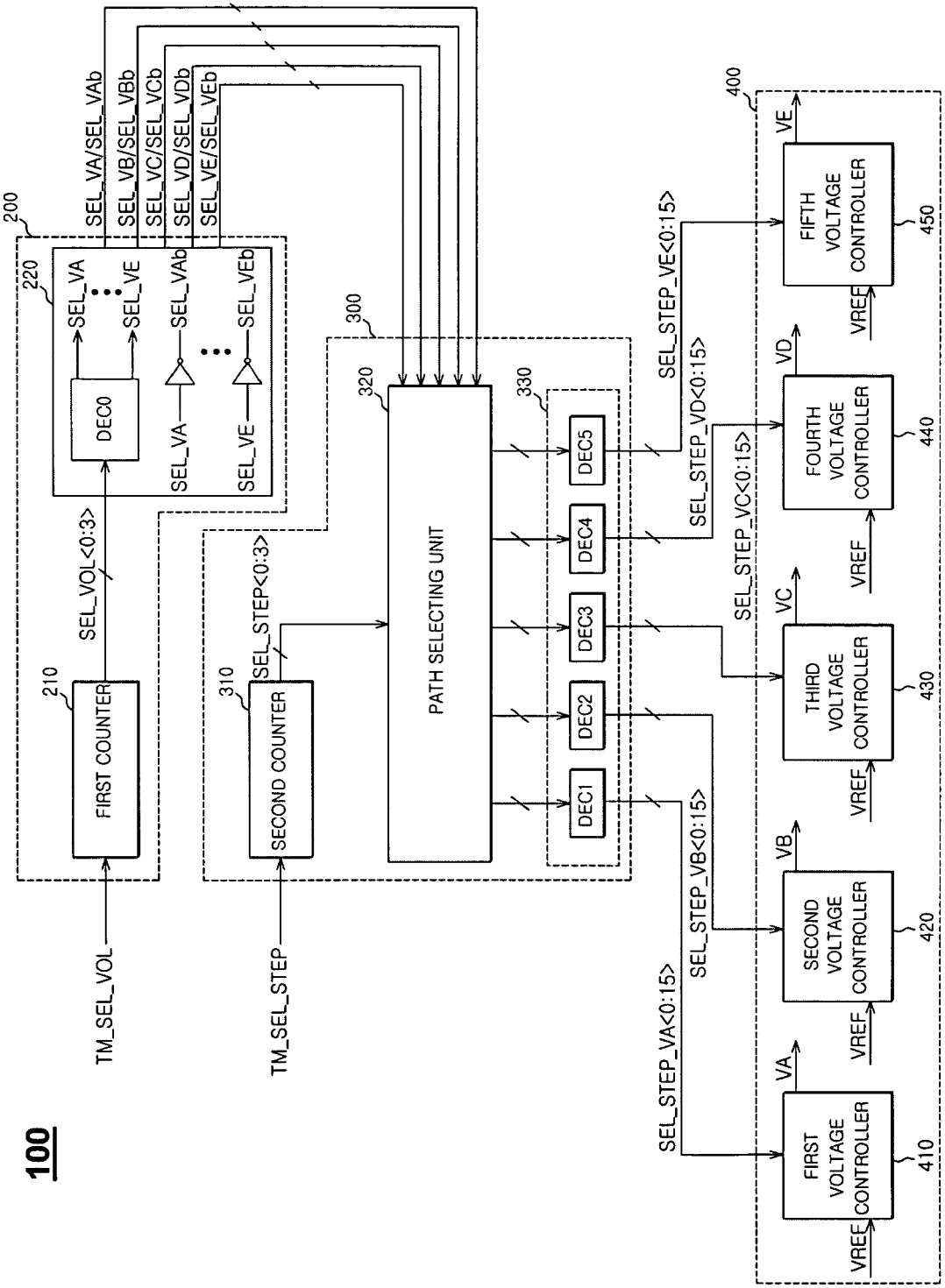
FIG. 2 is a schematic block diagram of an exemplary device for controlling a voltage of a semiconductor IC according to one embodiment.

FIG. 2 is a schematic block diagram of an exemplary device for controlling a voltage of a semiconductor IC according to one embodiment. In FIG. 2, a device 100 can be configured for controlling a voltage of a semiconductor integrated circuit and can include a voltage selecting unit 200, a control step selecting unit 300, and a voltage controlling unit 400. The voltage selecting unit 200 can be configured to output first to fifth voltage selection signals 'SEL_VA/SEL_VAb' to 'SEL_VE/SEL_VEb' according to a first test signal 'TM_SEL_VOL'. The first test signal 'TM_SEL_VOL', which can be a test signal used for selecting one of the first to fifth voltages VA to VE, can have a pulse-type format. The first to fifth voltage selection signals 'SEL_VA/SEL_VAb' to 'SEL_VE/SEL_VEb' can be signals used for selecting voltages to be controlled among the first to fifth voltages VA to VE by correspondingly meeting one-to-one to the first to fifth voltages VA to VE.

The control step selecting unit 300 can be configured to output first to fifth control step selection signals 'SEL_STEP_VA<0:15>' to 'SEL_STEP_VE<0:15>' according to a second test signal 'TM_SEL_STEP'. The second test signal 'TM_SEL_STEP', which can be a test signal for selecting a control step of the first to fifth voltages VA to VE, can have a pulse-type format. The first to fifth control step selection signals 'SEL_STEP_VA<0:15>' to 'SEL_STEP_VE<0:15>' can be signals used for selecting one of 16 control steps for each of the first to fifth voltages VA to VE.

The voltage selecting unit 200 can be arranged to include a first counter 210 and a signal generating unit 220. The first counter 210 can be configured to count a generation frequency of the first test signal 'TM_SEL_VOL' to output a first count signal 'SEL_VOL<0:3>'. The signal generating unit 220 can be configured to include a decoder DECO and a plurality of inverters. The decoder DECO can be configured to decode the first count signal 'SEL_VOL<0:3>' to output the decoding signals 'SEL_VA' to 'SEL_VE'. The plurality of inverters can be configured to receive the decoding signals 'SEL_VA' to 'SEL_VE' to output their complementary signals 'SEL_VAb' to 'SEL_VEb', respectively. The decoding signals 'SEL_VA' to 'SEL_VE' and their complementary signals 'SEL_VAb' to 'SEL_VEb' can form pairs, which can be used as the first to fifth voltage selection signals 'SEL_VA/ SEL_VAb' to 'SEL_VE/SEL_VEb', respectively.

The control step selecting unit 300 can include a second counter 310, a path selecting unit 320, and a decoding unit 330. The second counter 310 can be configured to count the generation frequency of the second test signal 'TM_SEL_ STEP' to output the second count signals 'SEL_STEP<0:3>'. The path selecting unit 320 can be configured to set a path of the second count signal 'SEL_STEP<0:3>' so that the second count signal 'SEL_STEP<0:3>' can be input to any one of first to fifth decoders DEC1 to DEC5 in the decoding unit 330 according to the first to fifth voltage selection signals 'SEL_VA/SEL_VAb' to 'SEL_VE/SEL_VEb'. The decoding unit 330 can include the first to fifth decoders DEC1 to DEC5. When the second count signal SEL_STEP <0:3> is input, the first to fifth decoders DEC1 to DEC5 can be configured to decode the second count signal 'SEL_STEP <0:3>' with the first to fifth control step selection signals 'SEL_ STEP_VA<0:15>' to 'SEL_STEP_VE<0:15>' to be output to first to fifth voltage controlling units 410 to 450.

The voltage controlling unit 400 can include the first to fifth voltage controllers 410 to 450 for controlling the first to fifth voltages VA to VE levels using any one of the 16 steps according to the first to fifth control step selection signals 'SEL_ STEP_VA <0:15>' to 'SEL_STEP_VE<0:15>'. Here, the first to fifth voltage controllers 410 to 450 may have substantially the same configuration. The first to fifth voltage controllers 410 to 450 can be configured to shift a reference voltage VREF level through a voltage generating circuit, i.e., a Widlar Circuit, and divide the shifted voltage level to generate voltages according to the 16 steps. Then, the first to fifth voltage controllers 410 to 450 can be configured to select and output one of the voltages according to the 16 steps corresponding to the first to fifth control step selection signals 'SEL_STEP_VA<0:15>' to 'SEL_STEP_VE<0:15>'.

Figure 3:
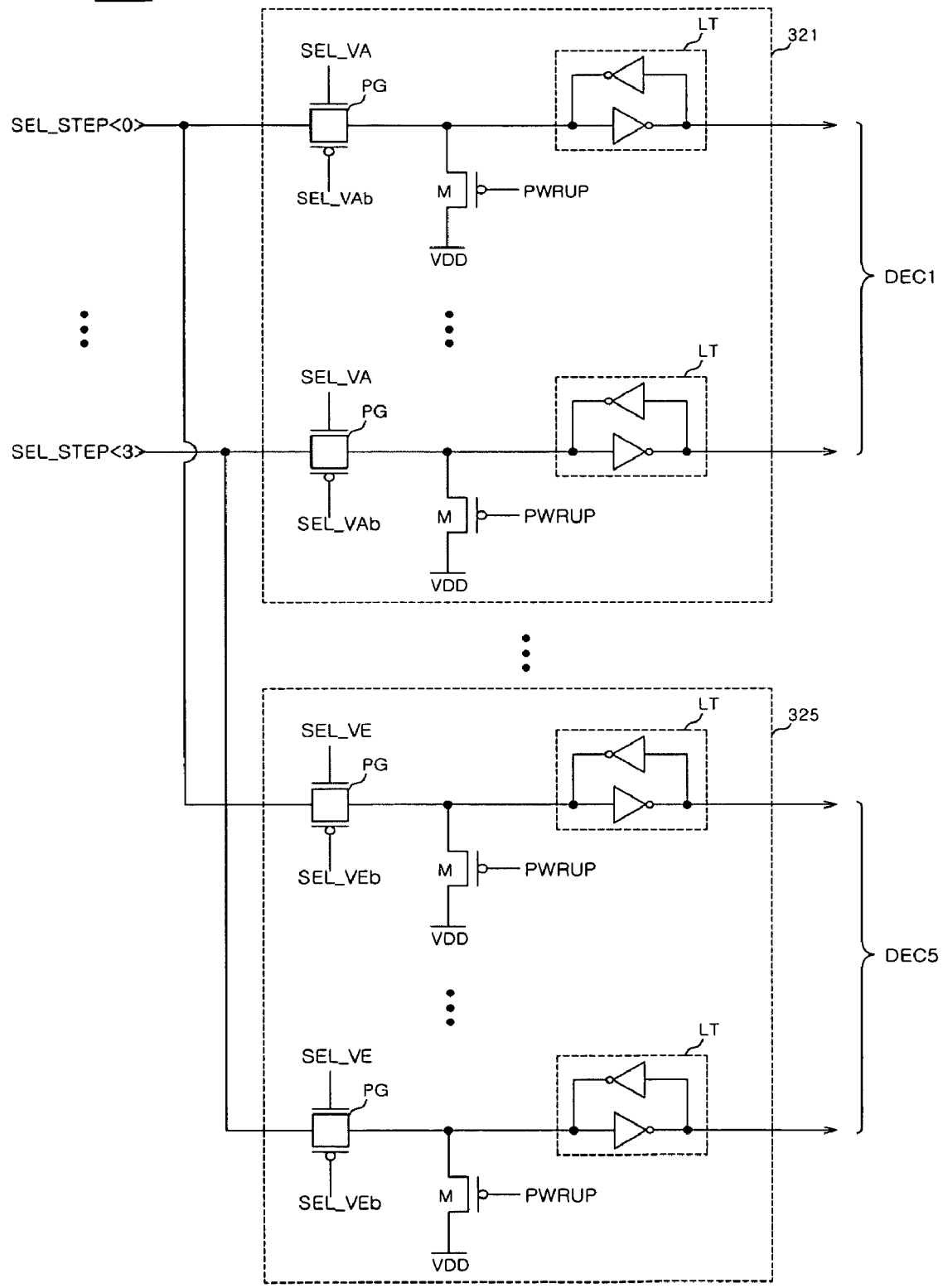
FIG. 3 is a schematic circuit diagram of an exemplary path selecting unit of FIG. 2 according to one embodiment.

FIG. 3 is a schematic circuit diagram of an exemplary path selecting unit of FIG. 2 according to one embodiment. In FIG. 3, the path selecting unit 320 can include first to fifth path selectors 321 to 325, wherein the first to fifth path selectors 321 to 325 can have substantially the same configuration. The first path selector 321 can be configured with a set of four circuits that can include a pass gate PG, a transistor M, and a latch, wherein the pass gate PG or the transistor M can function as transfer elements.

The first path selector 321 can be configured to initialize an input level of the first decoder DEC1 according to a power-up signal 'PWRUP', and input a second count signal 'SEL_ STEP<0:3>' to the first decoder DEC1 when the first voltage selection signal 'SEL_VA/SEL_VAb' is activated. The second to fifth path selectors 322 to 325 can be configured to initialize input levels of the second to fifth decoders DEC2 to DEC5 according to the power-up signal 'PWRUP', and input the second count signal 'SEL_STEP<0:3>' to the second to fifth decoders DEC2 to DEC5 when the second to fifth voltage selection signals 'SEL_VB/SEL_VBb' to 'SEL_VE/ SEL_VEb' are activated.

A method according to one exemplary embodiment for controlling the voltage of a semiconductor IC will now be described, based upon an assumption that the first voltage VA is selected at an initial stage of operation and a first step of the 16 control steps is selected. Accordingly, a difference in voltage exists for each of the 16 steps. The first step can include any one of the 16 steps, but does not necessarily define a voltage level. For example, the voltage level of the first step can be defined by one of the various levels, such as a lowest level, a highest level, or an intermediate level.

Each time that the first test signal 'TM_SEL_VOL' is generated, the voltage can be selected in order of a second voltage VB, a third voltage VC, etc., for example and each time the second test signal 'TM_SEL_STEP' is generated, the control step can be selected in order of a second step, a third step, etc., for example.

When the fifth voltage VE is controlled to the third step, the first test signal 'TM_SEL_VOL' can be generated four times and the second test signal 'TM_SEL_STEP' can be generated two times. As the first test signal TM_SEL_VOL is generated four times, the first counter 210 can count the first test signal 'TM_SEL_VOL' generated four times to output the first count signal 'SEL_VOL <0:3>'. As the second test signal 'TM_SEL_STEP' is generated two times, the second counter 310 can count the second test signal 'TM_SEL_STEP' generated two times to output the second count signal 'SEL_ STEP <0:3>'.

The decoder DECO in the signal generating unit 220 can decode the first count signal 'SEL_VOL<0:3>', and can invert the decoded first count signal 'SEL_VOL<0:3>' through the plurality of inverters to activate the fifth voltage selection signal 'SEL_VE/SEL_VEb'. When the fifth voltage selection signal 'SEL_VE/SEL_VEb' is activated, the pass gates PGs in the fifth path selector 325 of the path selecting unit 320 (of FIG. 3) can be turned-ON to output the second count signal 'SEL_STEP <0:3>' to the fifth decoder DEC5. For example, the fifth decoder DEC5 can decode the second count signal 'SEL_STEP <0:3>', and can output the fifth control step selection signal 'SEL_STEP_VE <0:15>' to the fifth voltage controller 450. In addition, the fifth voltage controller 450 can control the fifth voltage VE level to the third step according to the fifth control step selection signal 'SEL_ STEP_VE <0:15>'.

When the first to fourth voltage selection signals 'SEL_VA/SEL_VAb' to 'SEL_VD/SEL_VDb' are inactivated, the pass gates PGs in the first to fourth selectors 321 to 324 can be in a turned-OFF state. As a result, the first to fourth decoders DEC1 to DEC4 can receive an initial value 0000 set by the power-up signal 'PWRUP'. Accordingly, the first to fourth decoders DEC1 to DEC4 can decode the initial value 0000, and output the decoded initial value 0000 to the first to fourth voltage controllers 410 to 440. As a result, the first to fourth voltage controllers 410 to 440 can maintain the first to fourth voltages VA to VD at an initial step.

The first to fourth voltages VA to VD can be controlled at a desiring step by selecting one of them according to substantially the same method described above.

According to the present embodiment, if one kind of internal voltage is increased, additional area on the semiconductor IC for the test signal and the counter can be minimized.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A device for controlling a voltage of a semiconductor integrated circuit, comprising:
    a voltage selecting unit that generates a voltage selecting signal for selecting a voltage to be controlled among a plurality of voltages by using a first control signal;
    a control step selecting unit that generates a control step selection signal for selecting a control step of the voltage to be controlled by using a second control signal and the voltage selecting signal; and
    a voltage controlling unit that controls a level of the voltage to be controlled among the plurality of voltages in response to the control step selection signal.

2. The device of claim 1, wherein the voltage selecting unit includes:
    a counter that counts an input frequency of the first control signal to output a count signal; and
    a signal generating unit that decodes the count signal to generate the voltage selection signal.

3. The device of claim 1, wherein the control step selecting unit includes:
    a counter that counts an input frequency of the second control signal to output a count signal;
    a path selecting unit that selects one of a plurality of paths in response to the voltage selection signal and outputs the count signal to the selected path; and
    a decoding unit that decodes the count signal to output the control step selection signal.

4. The device of claim 3, wherein the path selecting unit includes a plurality of circuit blocks that commonly receive the count signal and pass the count signal through a path connected to the plurality of circuit blocks in response to the activation of the voltage selection signal.

5. The device of claim 4, wherein the circuit block includes:
    a transfer element that passes the count signal in response to the voltage selection signal; and
    a latch connected to an output terminal of the transfer element.

6. The device of claim 4, wherein the voltage controlling unit includes a plurality of voltage controllers that are connected to each of the plurality of paths and controls the plurality of voltages in response to the control step selection signal input through the plurality of paths.

7. A device for controlling a voltage of a semiconductor integrated circuit, comprising:
    a plurality of voltage controlling units that selectively control a plurality of voltage levels in response to a control step selection signal;
    a control step selecting unit that generates the control step selection signal according to a first control signal; and
    a voltage selecting unit that inputs the control step selection signal to any one corresponding to a second control signal among the plurality of voltage controlling units.

8. The device of claim 7, wherein the control step selecting unit includes:
    a counter that counts an input frequency of the first control signal to output a first count signal; and
    a decoding unit that decodes the first count signal to generate the control step selection signal.

9. The device of claim 8, wherein the voltage selecting unit includes:
    a counter that counts an input frequency of the first second control signal to output a second count signal;
    a signal generating unit that decodes the second count signal to generate a voltage selection signal; and
    a path selecting unit that outputs the first count signal through a path corresponding to the voltage selection signal among a plurality of paths connected to the decoding unit.

10. The device of claim 9, wherein the path selecting unit includes a plurality of circuit blocks that commonly receive the first count signal and pass the count signal through a path connected to the plurality of circuit blocks in response to the activation of the voltage selection signal.

11. The device of claim 10, wherein the circuit block includes:
    a transfer element that passes the first count signal in response to the voltage selection signal; and
    a latch connected to an output terminal of the transfer element.

12. A method for controlling a voltage of a semiconductor integrated circuit including a plurality of voltage controlling units that controls a plurality of voltage levels, the method comprising:
    selecting any one of input paths of the plurality of voltage controlling units according to a first control signal; and
    inputting a control step selection signal generated according to a second control signal to one of the plurality of voltage controlling units via the selected input path to perform a control of a corresponding voltage level.

13. The method of claim 12, wherein the first control signal is a first test signal input in a pulse form and the second control signal is a second test signal input in a pulse form.

14. The method of claim 13, wherein the selecting the input path includes:
    counting an input frequency of the first test signal to output a count signal; and
    selecting the input path according to a decoding value obtained by decoding the count signal among the input paths.

15. The method of claim 13, wherein the control step selection signal counts an input frequency of the second test signal and is generated by decoding a count value.

* * * * *